United States Patent
Peterson et al.

(10) Patent No.: US 11,217,471 B2
(45) Date of Patent: Jan. 4, 2022

(54) MULTI-AXIS MOVEMENT FOR TRANSFER OF SEMICONDUCTOR DEVICES

(71) Applicant: Rohinni, LLC, Coeur d'Alene, ID (US)

(72) Inventors: Cody Peterson, Hayden, ID (US); Andrew Huska, Liberty Lake, WA (US)

(73) Assignee: Rohinni, LLC, Coeur d'Alene, ID (US)

( * ) Notice: Subject to any disclaimer, the term of this patent is extended or adjusted under 35 U.S.C. 154(b) by 0 days.

(21) Appl. No.: 16/294,756

(22) Filed: Mar. 6, 2019

(65) Prior Publication Data
US 2020/0286770 A1    Sep. 10, 2020

(51) Int. Cl.
*H01L 21/683*    (2006.01)
*H01L 21/67*    (2006.01)
(Continued)

(52) U.S. Cl.
CPC ...... *H01L 21/6835* (2013.01); *H01L 21/4853* (2013.01); *H01L 21/67132* (2013.01);
(Continued)

(58) Field of Classification Search
CPC ......... H01L 21/67132; H01L 21/67144; H01L 21/67715; H01L 21/6836; H01L 2221/68354; H01L 2223/54426; H01L 2224/75824; H01L 33/62; H01L 21/68; H01L 21/6835; H01L 21/67259; H01L 22/20; H01L 21/4853; H01L 2221/68309;
(Continued)

(56) References Cited

U.S. PATENT DOCUMENTS 6,551,048 B1    4/2003    Bayan et al.
7,560,303 B2    7/2009    Wang et al.
(Continued)

FOREIGN PATENT DOCUMENTS

CN    107431024 A    12/2017
JP    08266980    * 10/1996
(Continued)

OTHER PUBLICATIONS

The PCT Search Report and Written Opinion dated Dec. 19, 2019 for PCT Application No. PCT/US2019/053199, 7 pages.
(Continued)

*Primary Examiner* — Duy T Nguyen
(74) *Attorney, Agent, or Firm* — Lee & Hayes, P.C.

(57) ABSTRACT

A method for executing a direct transfer of semiconductor device die from a first substrate to transfer locations on a second substrate. The method includes determining a position of impact wires disposed on a transfer head, semiconductor device die, and transfer locations; determining whether there are at least two positions that an impact wire, a semiconductor device die, and a transfer locations are aligned within a threshold tolerance; and transferring, by the impact wires, the semiconductor device die such that the semiconductor device die detaches from the first substrate and attaches to transfer locations on the second substrate. The transferring being completed based at least in part on determining that the impact wire, the semiconductor device die, and the circuit trace are aligned within the threshold tolerance.

9 Claims, 7 Drawing Sheets

(51) Int. Cl.
*H01L 21/66* (2006.01)
*H01L 21/48* (2006.01)

(52) U.S. Cl.
CPC ........ *H01L 21/67259* (2013.01); *H01L 22/20* (2013.01); *H01L 2221/68309* (2013.01); *H01L 2221/68363* (2013.01); *H01L 2221/68381* (2013.01)

(58) Field of Classification Search
CPC . H01L 2221/68381; H01L 2221/68363; H01L 21/681; H01L 2224/80121; H01L 2221/68322; H01L 2224/75802; H01L 2224/75804; H01L 2224/80006; H01L 2224/75702; H01L 24/80; H01L 2224/08225; H01L 2224/08238; H01L 2224/80385; H01L 24/08; H01L 24/97; H01L 2224/97; H01L 2224/75901; H01L 2224/7598; H01L 2224/75305; H01L 24/75; H01L 2924/12041; H01L 21/67236; H01L 21/68778
USPC .......................................................... 438/5
See application file for complete search history.

(56) References Cited

U.S. PATENT DOCUMENTS

| | | | |
|---|---|---|---|
| 9,633,883 | B2 | 4/2017 | Huska et al. |
| 10,297,478 | B2 | 5/2019 | Peterson et al. |
| 2004/0142540 | A1 | 7/2004 | Kellar et al. |
| 2008/0124842 | A1* | 5/2008 | Wang ............... H01L 24/97 438/118 |
| 2014/0142740 | A1 | 5/2014 | Prakapenka et al. |
| 2016/0276205 | A1* | 9/2016 | Huska ............... H01L 22/20 |
| 2018/0261525 | A1 | 9/2018 | Tolentino et al. |
| 2018/0286838 | A1 | 10/2018 | Huska et al. |
| 2019/0333791 | A1* | 10/2019 | Hussell ............ H01L 21/6836 |
| 2020/0105570 | A1 | 4/2020 | Peterson et al. |

FOREIGN PATENT DOCUMENTS

| | | |
|---|---|---|
| RU | 2071144 | 12/1996 |
| RU | 2498449 | 11/2013 |
| TW | 201812286 | 4/2018 |
| TW | M557658 | 4/2018 |
| TW | 201831915 | 9/2018 |
| WO | WO2012142177 | 10/2012 |

OTHER PUBLICATIONS

The Taiwanese Office Action dated Sep. 22, 2020 for Taiwanese Patent Application No. 108135266, a counterpart of U.S. Appl. No. 16/147,055, 5 pages.

The PCT Search Report and Written Opinion dated Jun. 4, 2020 for PCT Applciation No. PCT/US2020/020347, 7 pages.

The Chinese Office Action dated Nov. 10, 2020 for Chinese Patent Application No. 202080002394.8, a counterpart of U.S. Appl. No. 16/294,756,1 page.

Office Action for U.S. Appl. No. 16/147,055, dated Jan. 15, 2021, Peterson, "Variable Pitch Multi-Needle Head for Transfer of Semiconductor Devices", 7 Pages.

Taiwanese Office Action dated Nov. 26, 2020 for Taiwanese Patent Application No. 109107223, a counterpart foreign application of U.S. Appl. No. 16/294,756, 6 pages.

The Chinese Office Action dated Mar. 4, 2021 for Chinese Patent Application No. 201980027553.7, a counterpart of U.S. Appl. No. 16/147,055, 3 pages.

Chinese Office Action dated May 26, 2021 for Chinese Patent Application No. 202080002394.8, a foreign counterpart to U.S. Appl. No. 16/294,756, 6 pages.

* cited by examiner

MULTI-AXIS MOVEMENT FOR TRANSFER OF SEMICONDUCTOR DEVICES

CROSS REFERENCE TO RELATED PATENT APPLICATIONS

This application incorporates U.S. patent application Ser. No. 14/939,896, filed on Nov. 12, 2015, entitled "Apparatus for Transfer of Semiconductor Devices," now issued as U.S. Pat. No. 9,633,883, and U.S. patent application Ser. No. 15/978,094, filed on May 12, 2018, entitled "Method and Apparatus for Multiple Direct Transfers of Semiconductor Devices," in their entireties by reference.

BACKGROUND

Semiconductor devices are electrical components that utilize semiconductor material, such as silicon, germanium, gallium arsenide, and the like. Semiconductor devices are typically manufactured as single discrete devices or as integrated circuits (ICs). Examples of single discrete devices include electrically-actuatable elements such as light-emitting diodes (LEDs), diodes, transistors, resistors, capacitors, fuses, and the like.

The fabrication of semiconductor devices typically involves an intricate manufacturing process with a myriad of steps. The end-product of the fabrication is a "packaged" semiconductor device. The "packaged" modifier refers to the enclosure and protective features built into the final product as well as the interface that enables the device in the package to be incorporated into an ultimate circuit.

The conventional fabrication process for semiconductor devices starts with handling a semiconductor wafer. The wafer is diced into a multitude of "unpackaged" semiconductor devices. The "unpackaged" modifier refers to an unenclosed semiconductor device without protective features. Herein, unpackaged semiconductor devices may be called semiconductor device die, or just "die" for simplicity. A single semiconductor wafer may be diced to create die of various sizes, so as to form upwards of more than 100,000 or even 1,000,000 die from the semiconductor wafer (depending on the starting size of the semiconductor), and each die has a certain quality. The unpackaged die are then "packaged" via a conventional fabrication process discussed briefly below. The actions between the wafer handling and the packaging may be referred to as "die preparation."

In some instances, the die preparation may include sorting the die via a "pick and place process," whereby diced die are picked up individually and sorted into bins. The sorting may be based on the forward voltage capacity of the die, the average power of the die, and/or the wavelength of the die.

Typically, the packaging involves mounting a die into a plastic or ceramic package (e.g., mold or enclosure). The packaging also includes connecting the die contacts to pins/wires for interfacing/interconnecting with ultimate circuitry. The packaging of the semiconductor device is typically completed by sealing the die to protect it from the environment (e.g., dust).

A product manufacturer then places packaged semiconductor devices in product circuitry. Due to the packaging, the devices are ready to be "plugged in" to the circuit assembly of the product being manufactured. Additionally, while the packaging of the devices protects them from elements that might degrade or destroy the devices, the packaged devices are inherently larger (e.g., in some cases, around 10 times the thickness and 10 times the area, resulting in 100 times the volume) than the die found inside the package. Thus, the resulting circuit assembly cannot be any thinner than the packaging of the semiconductor devices.

As mentioned previously, a single semiconductor wafer may be diced to create more than 100,000 or 1,000,000 die from the semiconductor wafer. Therefore, these machines used in transferring semiconductor die require extreme precision. Thus, transfer mechanisms are often built with a specific design purpose in mind and are built with tight constraints to ensure precision and accuracy. However, these transfer mechanisms often lack variability and adaptability to different applications or manufacturing purposes. For example, a transfer mechanism will be used to transfer die for a specific product and then may be reconfigured or adjusted to transfer die for another product. The reconfiguration can be time consuming, inefficient, and, at times, requires tearing down and rebuilding components on a machine.

BRIEF DESCRIPTION OF THE DRAWINGS

The Detailed Description is set forth with reference to the accompanying figures. In the figures, the left-most digit(s) of a reference number identifies the figure in which the reference number first appears. The use of the same reference numbers in different figures indicates similar or identical items. Furthermore, the drawings may be considered as providing an approximate depiction of the relative sizes of the individual components within individual figures. However, the drawings are not to scale, and the relative sizes of the individual components, both within individual figures and between the different figures, may vary from what is depicted. In particular, some of the figures may depict components as a certain size or shape, while other figures may depict the same components on a larger scale or differently shaped for the sake of clarity.

DETAILED DESCRIPTION

Overview

Figure 1:
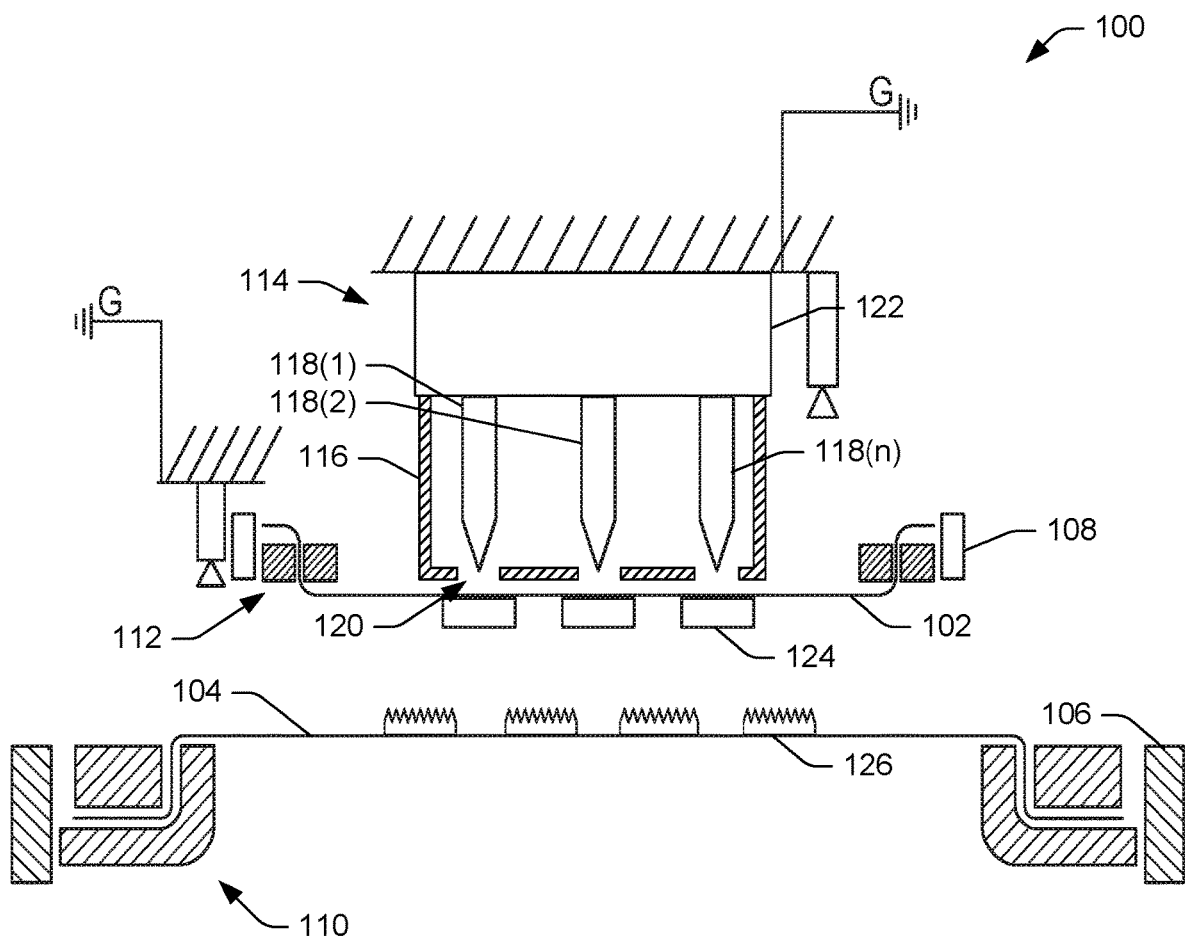
FIG. 1 represents a schematic view of a direct transfer apparatus in a pre-transfer position according to an embodiment of this disclosure.

This disclosure is directed generally to a transfer mechanism that directly transfers semiconductor device die from one substrate (often referred to herein as a first substrate) to another substrate (often referred to herein as a second substrate), such as a die substrate (e.g., blue tape, semiconductor wafer on tape, etc.), a circuit substrate (e.g., printed circuit board, flexible or rigid, metal or plastic, surface of a circuit), another die (i.e., die stacked on die, where the die to be stacked on acts as the "substrate" to receive the transferred die), etc., and to the general process for achieving the same. In an embodiment, the transfer mechanism may function to transfer unpackaged die directly from a substrate, such as a "wafer tape," to a product substrate, such as a circuit substrate. The direct transfer of unpackaged die may significantly reduce the thickness of an end product compared to a similar product produced by conventional means, as well as the amount of time and/or cost to manufacture the product substrate.

For the purpose of this description, the term "substrate" refers to any substance on which, or to which, a process or action occurs. Further, the term "product" refers to the desired output from a process or action, regardless of the state of completion. Thus, a product substrate may refer to any substance on which or to which a process or action is caused to occur for a desired output. The wafer tape may also be referred to herein as the semiconductor device die substrate, or simply a die substrate.

In an embodiment, the transfer mechanism may transfer a semiconductor device die directly from a wafer tape to a product substrate without "packaging" the die. The transfer mechanism may be disposed vertically above the wafer tape and may actuate impact wires so as to press down on the die via the wafer tape toward the product substrate. This process of pressing down on the die may cause the die to peel off of the wafer tape, starting at the sides of the die until the die separates from the wafer tape to be attached to the product substrate. That is, by reducing the adhesion force between the die and the wafer tape, and by increasing the adhesion force between the die and the product substrate, the die may be transferred.

A transfer machine may secure a product substrate for receiving "unpackaged" die, such as LEDs, transferred from the wafer tape, for example. In an effort to reduce the dimensions of the products using the die, the die are very small and thin, for example, a die may be about 12 microns to 50 microns in height and may range from about 100 microns to 400 microns, or more or less, in lateral dimensions. However, embodiments of the transfer machine discussed herein may accommodate the transfer of die that are greater in size than the aforementioned dimensions. Nevertheless, embodiments of the transfer machine discussed herein may be particularly well-suited for the transfer of microLEDs, ranging in size as aforementioned. Due to the relatively small size of the die, the transfer machine includes components that function to precisely align both the wafer tape carrying the die and the product substrate to ensure accurate placement and/or avoid product material waste. In an embodiment, the components that align the product substrate and the die on the wafer tape may include a set of frames in which the wafer tape and the product substrate are secured respectively and conveyed individually to a position of alignment such that a specific die on the wafer tape is transferred to a specific spot on the product substrate.

The frame that conveys the product substrate may travel in various directions, including in-plane horizontal, vertical, and/or rotational directions for various axes of alignment, or even out-of-plane directions that would permit transfer to a curved surface. The frame that conveys the wafer tape may travel in various directions also. A system of gears, tracks, motors, and/or other elements may be used to secure and convey the frames carrying the product substrate and the wafer tape respectively to align the product substrate with the wafer tape in order to place a die on the correct position of the product substrate. Each frame system may also be moved to an extraction position in order to facilitate extraction of the wafer tape and the product substrate upon completion of the transfer process. It is also to be appreciated that any or all of the first substrate, second substrate, and transfer mechanism may be movable with respect to each other to facilitate the most efficient alignment of components based on the particular embodiment.

In an embodiment, the transfer mechanism may include a multi-needle transfer head, similar to print heads used in dot matrix printers, which therefore may also be referred to hereinafter as a "dot matrix transfer head." The dot matrix transfer head may include a plurality of impact wires (also referred to herein as "needles" or "pins") that may be individually actuated concurrently or sequentially. The plurality of impact wires may be implemented to directly transfer a plurality of semiconductor device die from the first substrate, such as a wafer tape, to the second substrate, such as a product substrate. The dot matrix transfer head may further include a housing, the housing may include an actuating assembly configured to control actuation of the plurality of impact wires. The dot matrix transfer head may also include a splaying element. The splaying element may be configured to spread the plurality of impact wires at a specified distance from each other. In an embodiment, the splaying element may be included as an integral part of the housing. However, in another embodiment, the splaying element may be removably attached to the housing. The dot matrix transfer head may also include a guide (also referred to as a guide head) that may attach to a side of the splaying element and/or the housing. The guide may be configured to maintain a lateral position of the plurality of impact wires during a transfer process. In an embodiment, the guide may contact a surface of the wafer tape prior to a transfer operation. However, in other embodiments, the guide may be disposed proximate to a surface of the wafer tape without any or with only some intermittent direct contact prior to a transfer operation.

In an embodiment, the plurality of impact wires may be configured in a multi-pitch dot matrix configuration (referred to herein as "multi-pitch"). The term "pitch," as used herein, refers to the spacing between objects or points. However, when used in reference to the arrangement of the plurality of impact wires, the term "pitch" refers to the spacing of the impact wires and thus how the plurality of impact wires may or may not align with one or more other components, e.g., die to be transferred, location for transfer, etc. For example, in an embodiment, the multi-pitch configuration may arrange the plurality of impact wires at a constant distance from one another such that the plurality of impact wires are evenly spaced apart rather than being spaced to align with specific circuit trace patterns or the arrangement of the semiconductor device die on a wafer tape. The term "multi-pitch" is used because the multi-pitch configuration of the plurality of impact wires may be useful when semiconductor device die on a wafer tape or circuit traces on a product substrate are spaced unevenly (i.e., having multiple distinct pitches between die or traces). That is, having the plurality of impact wires spaced evenly from one another may increase the chance that at least one impact wire of the plurality of impact wires may align with at least one of a semiconductor device die or circuit trace. The multi-pitch configuration may be achieved by attaching a guide head to the arrangement of the plurality of impact wires in the multi-pitch configuration.

Additionally, and/or alternatively, in an embodiment, the plurality of impact wires may be arranged in a matched-pitch configuration. In such an embodiment, the plurality of impact wires may be arranged to align with one of the predetermined pitch of circuit traces on a product substrate, the transfer locations for a transfer without attachment to a circuit trace, or according to the positions of semiconductor device die as arranged on a wafer tape from which the die are to be transferred. The particular alignment may be determined by which of the circuit traces or the semiconductor device die are spaced at more constant intervals. For example, if the circuit traces to which die are to be transferred are spaced more evenly than the die positions on the substrate from which the die are to be transferred, then the plurality of impact wires may be arranged to align with the spacing of the circuit trace transfer locations when arranged in the matched-pitch configuration.

FIG. 1 illustrates an embodiment of an apparatus 100 (or "direct transfer apparatus") that may be used to directly transfer unpackaged semiconductor device die from a wafer tape 102 to a product substrate 104, or likewise, to transfer other electrical components from a carrier substrate, i.e., a substrate carrying one or more electrical components, to a product substrate. The wafer tape 104 may also be referred to herein as the semiconductor device die substrate, or simply a die substrate, or at times, a first substrate. The apparatus 100 may include a product substrate conveyance mechanism 106 and a wafer tape conveyance mechanism 108. The product substrate conveyance mechanism 106 may include a product substrate frame 110 and the wafer tape conveyance mechanism may include a wafer tape frame 112. In an embodiment, the product substrate frame 110 may secure the product substrate directly as depicted, or indirectly, for example, where the second substrate rests on top of a substrate support (not shown, but where 104 would represent the substrate support and the second substrate would be secured to a surface thereof with or without circuit traces on the second substrate, such as in U.S. application Ser. No. 15/409,409 now issued as U.S. Pat. No. 10,062,588). The apparatus 100 may further include a transfer mechanism 114, such as a dot matrix transfer head (referenced herein as 114), which, as shown, may be disposed vertically above the wafer tape 102. In an embodiment, the dot matrix transfer head 114 may be located so as to contact or nearly contact the wafer substrate 102. Moreover, one or more microadjustment mechanisms may be disposed with one or more of the product substrate conveyance mechanism, the wafer tape conveyance mechanism, or the transfer mechanism to make micro adjustments to the transfer position of the respective mechanisms before a transfer operation (see U.S. application Ser. No. 16/147,456).

The dot matrix transfer head 114 may further include a guide head 116, whereby a single impact wire 118(1) of a plurality of impact wires (118(1), 118(2), . . . 118(n); which are collectively referred to herein as 118) is inserted into a single hole of the multiple holes 120 of the guide head to maintain a position of each of the plurality of impact wires 118 during a transfer operation. For example, the guide head 116 may configure the plurality of impact wires 118 in an m×n matrix configuration. In such an example, the plurality of impact wires 118 may be inserted into the multiple holes 120 in the guide head 116, thereby guiding the plurality of impact wires 118 to actuate in an m×n matrix configuration (e.g., 12×2 matrix configuration, where there are twelve rows of holes and two columns of holes). Additionally, the guide head 116 may be configured to be easily replaced by another guide head having the same (in the case of replacement caused by damage, for example) or a different configuration of multiple holes. For example, a first guide head may be attached to the dot matrix transfer head 114 having a 12×2 matrix configuration for use on a first circuit design. Upon switching to perform transfers in a second circuit design that is distinct from the first circuit design, a second guide head, having an 8×3 matrix or other configuration, may be attached to the dot matrix transfer head 100, thereby replacing the first guide head. In an embodiment, the guide head 106 includes a base side and attachment side that opposes the base side, the guide head 116 being potentially removably attached to the dot matrix transfer head 114 via the attachment side.

The plurality of impact wires 118 may be connected to an actuator(s) 122. The actuator 122 may include a motor (not shown) connected to the plurality of impact wires 118 to drive the plurality of impact wires 118 toward the wafer tape 102 at predetermined and/or calculated and programmed times. In such an embodiment, the actuator 122 and/or the apparatus 100 may be communicatively coupled to a controller (not shown) that is configured to activate/control the actuator 122 and/or the other features described herein. In an embodiment, the plurality of impact wires 118 may be used to directly transfer unpackaged semiconductor device die 124 from the wafer tape 102 to the product substrate 104, such that at least one of the semiconductor device die 124 contacts and bonds to at least one circuit trace 126. Similarly, in an embodiment where a transfer does not involve a circuit trace (e.g., die stacking, wafer tape to wafer tape transfers, etc.), the transfer process may be considered as successful when a die 124 contacts and attaches to the second substrate and detaching from the first substrate.

Since the dot matrix transfer head 114 includes a plurality of impact wires 118, the dot matrix transfer head 114 may be configured and controlled to transfer multiple semiconductor device die 124 concurrently. Additionally, and/or alternatively, the dot matrix transfer head 114 may implement the plurality of impact wires 118 to transfer multiple semiconductor device die 124 sequentially. Though depicting three impact wires 118 in FIG. 1, in an embodiment, a dot matrix transfer head 114 may include two or more impact wires 118. For example, the plurality of impact wires 118 may include impact wires in quantities of 2, 3, 6, 12, 24, etc., and anywhere in between or greater than the example quantities.

Regardless of the quantity, individual impact wires of the plurality of impact wires may be independently-actuatable, enabling individual impact wires of the plurality of impact wires 118 to be actuated solitarily and/or in one or more groups. That is, for example, the dot matrix transfer head 114 may actuate a single impact wire 118(1) at a time, two or more impact wires (e.g., 118(1) and 118(n)) at a time, and/or all of the plurality of impact wires 118. In such an embodiment, the implementation of a head or a cluster of a plurality of impact wires 118 allows the transfer mechanism to transfer die in a manner that may be more efficient than a mechanism implementing a single impact wire. For example, as the dot matrix transfer head 114 moves over a product substrate, a transfer mechanism implementing a plurality of impact wires 118 may transfer more than one die at a time. Transferring multiple die via a head containing a plurality of impact wires 118 or a cluster of a plurality of needles 118 may significantly reduce total transfer time, as well as reduce the travel distance that the transfer mechanism would otherwise need to move.

Figure 2:
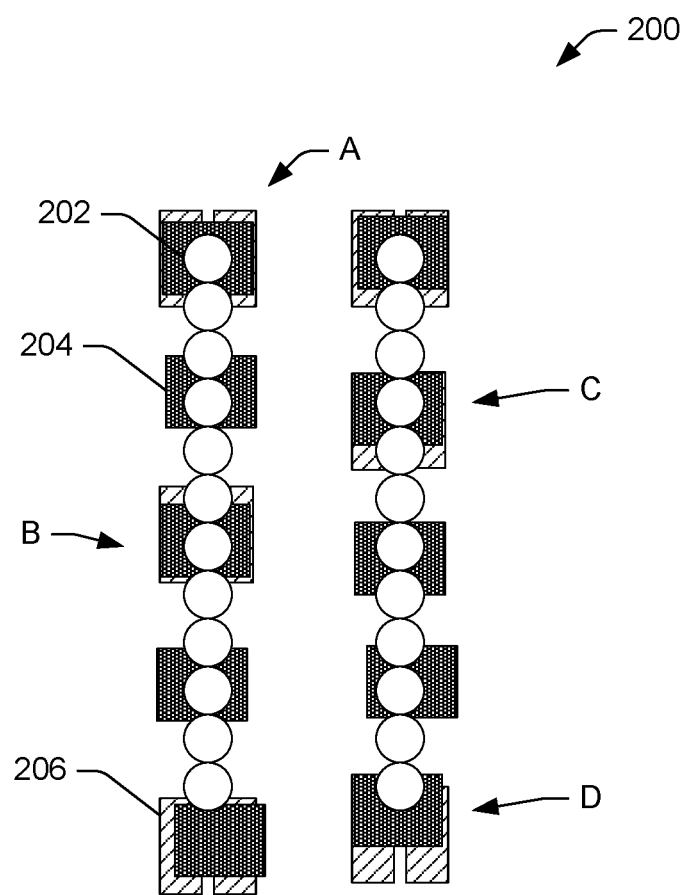
FIG. 2 illustrates a top-down schematic representation of a direct transfer apparatus in multi-pitch configuration along with circuit traces and semiconductor device die according to an embodiment of this disclosure.

FIG. 2 illustrates a top-down schematic representation of an embodiment of the direct transfer apparatus 100 having a plurality of impact wires 202 arranged in a multi-pitch configuration along with semiconductor device die 204 and circuit traces 206. As shown in FIG. 2, in the multi-pitch configuration each of the plurality of impact wires 202 in a row may be positioned evenly with respect to each other. However, in an alternative embodiment, the plurality of impact wires 202 may be relatively positioned at uneven intervals. In the multi-pitch configuration, the plurality of impact wires 202 may be spaced proximate to each other. In such an embodiment, the plurality of impact wires 202 may be spaced immediately adjacent to one another. For example, the plurality of impact wires 202 may be spaced only so far as to prevent collisions with each other. This multi-pitch configuration arranges the plurality of impact wires 202 such that each impact wire is disposed within the dot matrix transfer head such that a cycle of the impact wires during a transfer operation positions individual impact wires immediately adjacent to at least one other impact wire. As mentioned previously, the multi-pitch configuration has the ability to accommodate semiconductor device die and/or circuit traces disposed at a plurality of different pitches (or "spacing"). Since there is essentially one impact wire disposed next to another continuously along a row, the multi-pitch configuration may be implemented, for example, when semiconductor device die or circuit traces are used in the transfer process that have less than uniform spacing when held in their respective frames. As previously discussed, the multi-pitch configuration may be achieved by attaching a guide head having multiple holes that force the plurality of impact wires 202 into the configuration shown in FIG. 2.

Additionally, and/or alternatively, in an embodiment, the plurality of impact wires 202 may be attached to the transfer mechanism such that the plurality of impact wires 202 are arranged in the multi-pitch configuration. Note that spacing between individual impact wires may vary depending on the size of the die being transferred as well. That is, for a relatively large sized die (e.g., having a base dimension of ~400 microns or greater), the spacing may be greater between impact wires to accommodate for the larger footprint of the die. However, in an embodiment of a multi-pitch configuration in which the die to be transferred has a smaller size (e.g., having a base dimension of less than ~400 microns), the spacing may be smaller. For example, the plurality of impact wires 202 may be spaced apart, between 0.1 mm and 2 mm, between 0.25 mm and 1 mm, between 0.35 mm and 0.75 mm, between 0.4 mm and 0.6 mm, etc.

In an embodiment, as shown at location A, a die 204 may be transferred at a location where an impact wire 202, a die 204, and a circuit trace 206 all align. Upon alignment, the impact wire 202 may be actuated towards the die 204 such that the impact wire 202 presses the die 204 so that it contacts the circuit trace 206 and bonds thereto. Additionally, and/or alternatively, in an embodiment, the three components (impact wire, die, and circuit trace/transfer location) do not have to perfectly align for the transfer to be carried out. For example, in an embodiment, the die 204 may be transferred if the components align within a threshold tolerance. Locations B and C depict possible locations where the three components are not aligned through a central axis but may still be capable of transferring the semiconductor device die 204. Such a tolerance may be predetermined based on constraints of quality of a resulting product.

Figure 3:
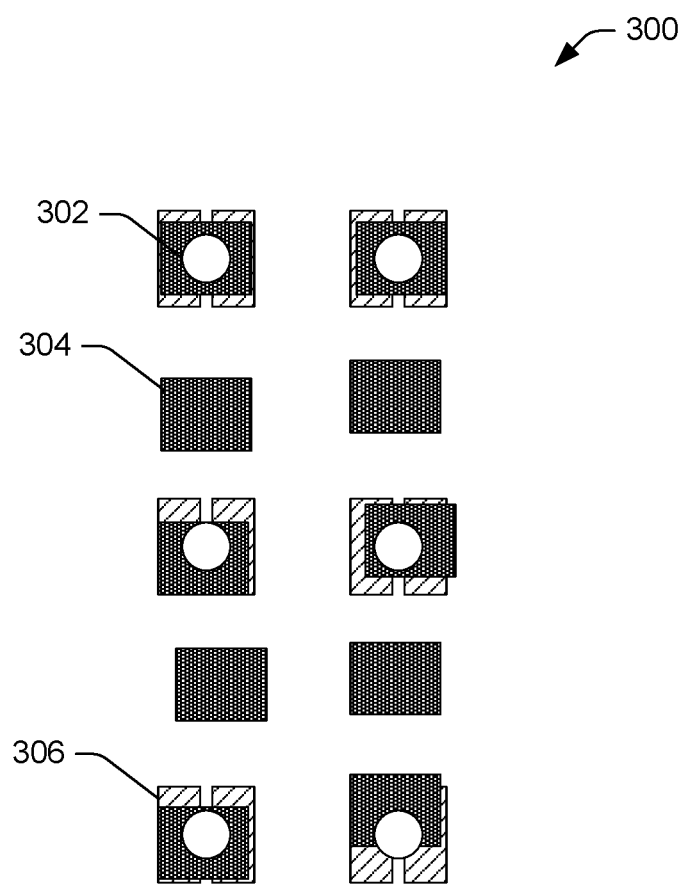
FIG. 3 illustrates a top-down schematic representation of a matched-pitch transfer apparatus along with circuit traces and semiconductor device die according to an embodiment of this disclosure.

FIG. 3 illustrates a top-down schematic representation of an embodiment of the direct transfer apparatus 100 having a plurality of impact wires 302 arranged in a matched-pitch configuration along with semiconductor device die 304 and circuit traces 306. As shown in FIG. 3, in the matched-pitch configuration each of the plurality of impact wires 302 are arranged to align with one other type of component. In the specific embodiment shown by FIG. 3, the plurality of impact wires 302 are arranged to align with the circuit traces 306 in the matched-pitch configuration. Additionally, and/or alternatively, in an embodiment, the plurality of impact wires 302 may be arranged to align with the semiconductor device die 304. In an embodiment, the plurality of impact wires 302 may be aligned to whichever component is the more consistently spaced. For example, if the circuit traces 306 have a more reliably-accurate fixed spacing between each of the circuit traces 306, then the plurality of impact wires 302 may be arranged to align with the circuit traces 306 in the matched-pitch configuration. However, if the semiconductor device die 304 have a more consistent spacing, then the plurality of impact wires 302 may be arranged to align with the semiconductor device die 304 in the matched-pitch configuration. The matched-pitch configuration allows two of the components to remain fairly stationary between transfer operations, while the third component may be adjusted as needed. For example, if the plurality of impact wires 302 are aligned with the circuit traces 306 in the matched-pitch configuration, then the semiconductor device die 302 may be the only components that may need to be adjusted for a transfer to be able to occur. Thus, rather than having to move the transfer mechanism, the wafer tape, and the product substrate to align the three components, only one component (e.g., wafer tape having the semiconductor device die disposed thereon) may need to be adjusted between transfers to ensure all three components are sufficiently aligned.

As previously discussed, the matched-pitch configuration may be achieved by attaching a guide head having multiple holes that force the plurality of impact wires 302 into the matched-pitch configuration shown in FIG. 3. Additionally, and/or alternatively, in an embodiment, a guide head may be used that can be adjusted between a matched-pitch and multi-pitch configuration without having to replace the guide head. Still further, in an embodiment, the plurality of impact wires 302 may be attached to the transfer mechanism such that the plurality of impact wires 302 are arranged in a matched-pitch configuration. As mentioned previously, the matched-pitch configuration arranges the plurality of impact wires 302 in the matched-pitch configuration during transfer operation positions of individual impact wires of the plurality of impact wires 302.

In an embodiment, the multi-pitch or matched pitch configuration may be selected based at least in part on the pitch of the circuit traces on the product substrate and/or the pitch of the semiconductor device die on the wafer tape. Additionally, and/or alternatively, in an embodiment, the plurality of impact wires may be grouped such that a first portion of the plurality of impact wires are arranged in a multi-pitch configuration and a second portion of the plurality of impact wires are arranged in a matched-pitch configuration. In an embodiment, the direct transfer apparatus may automatically switch guide heads to configure the plurality of impact wires in a multi or matched-pitch configuration. Additionally, and/or alternatively, a human operator may change the guide head on the dot matrix transfer head to arrange the needles in the desired configuration.

Figure 4:
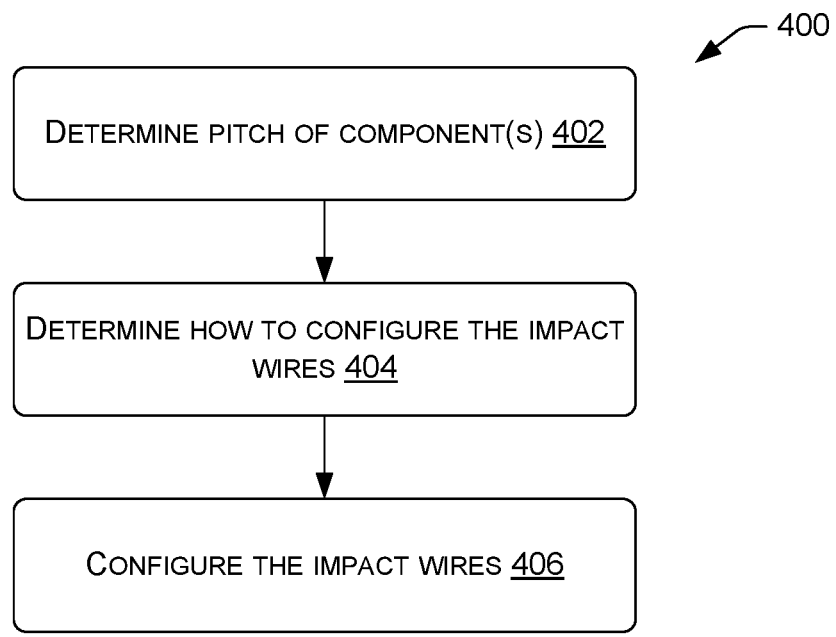
FIG. 4 illustrate a method for determining a configuration of a plurality of impact wires of a direct transfer apparatus according to an embodiment of this disclosure.

The above described process is illustrated in FIG. 4. For ease of explanation, the process 400 is described as being performed, at least in part, by the direct transfer apparatus 100. However, in an embodiment, the process 400 may be performed by another apparatus and/or an outside controller, computing resource, or human operator. Notably, while any one and/or all of the steps may be performed by a human operator, due to the nature of the application along with the size of the product components and desired speeds of work, the steps are best left to the processing capabilities of an electronic device. Additionally, and/or alternatively, in an embodiment, any one and/or all of the steps may be fully automated and carried out by the direct transfer apparatus 100.

At step 402, the pitch of a component of interest is determined, such as the semiconductor device die and/or the circuit traces. That is, the spacing or the distance (e.g., 0 mm or greater) in between individual ones of the semiconductor device die and/or the transfer locations, such as positions along a circuit trace or a substrate, is determined.

At step 404, a determination is made of how to configure the plurality of impact wires, based at least in part on the determined pitch of the semiconductor device die and/or the transfer locations. In such an embodiment, it may be determined whether to configure the plurality of impact wires in the matched-pitch configuration or the multi-pitch configuration. This determination may be based at least in part on which configuration may be more efficient in transferring die from a first substrate (e.g., a wafer tape of semiconductor device die) to a second substrate (e.g., a product substrate).

At step 406, the plurality of impact wires are configured in either the matched-pitch configuration or the multi-pitch configuration. In an alternative embodiment, the impact wires may be configured in a different configuration entirely (e.g., circular type pattern, mixed pattern, etc.). Thus, the plurality of impact wires may be arranged in a specific configuration via attaching a guide head that arranges the plurality of impact wires in the specific configuration.

Figure 5:
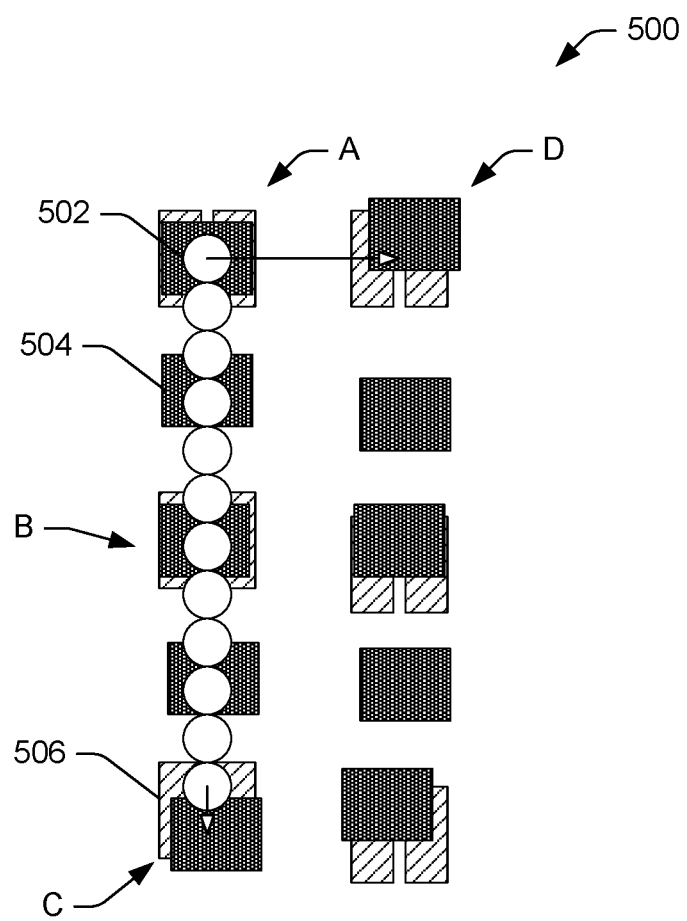
FIG. 5 illustrates a top-down schematic representation of a plurality of impact wires arranged in a multi-pitch configuration and example movements that a transfer apparatus may make to transfer semiconductor device die according to an embodiment of this disclosure.

FIG. 5 illustrates a top-down schematic representation of a plurality of impact wires 502 arranged in a multi-pitch configuration and example movements that the direct transfer apparatus 100 may make to transfer semiconductor device die 504 according to an embodiment. FIG. 5 illustrates a possible advantage of using a multi-pitch dot matrix transfer head over using a single impact wire transfer mechanism or a multiple impact wire mechanism having fixed impact wires. For example, FIG. 5 depicts how the plurality of impact wires 502 arranged in the multi-pitch configuration benefit a scenario in which the semiconductor device die 504 and the circuit traces 506 may be unevenly spaced. Having the plurality of impact wires 502 spaced such that one follows immediately after the other increases the likelihood that an impact wire may align with at least one other component, and in some instances may align with both of the other components such that a transfer operation may occur. For example, positions A and B represent locations that transfer operations may occur without any adjustment of any of the components. In an embodiment, the transfer mechanism may transfer multiple semiconductor device die 504 simultaneously. Position C may represent a location that an adjustment of the transfer head and/or another component may be necessary. In this example, the transfer mechanism may need to make a slight adjustment to the dot matrix transfer head and to the wafer tape to be able to perform a transfer operation at position C. In an embodiment, the transfer mechanism may prioritize transfers requiring only small adjustments before making large adjustments to make other transfers occur. For example, in an embodiment, the transfer mechanism may transfer semiconductor device die 504 at locations A, B, and C before making a bigger adjustment (or "jump") to the next row and adjusting components to complete a transfer at position D. This process is described further herein below with respect to FIG. 7.

Figure 6:
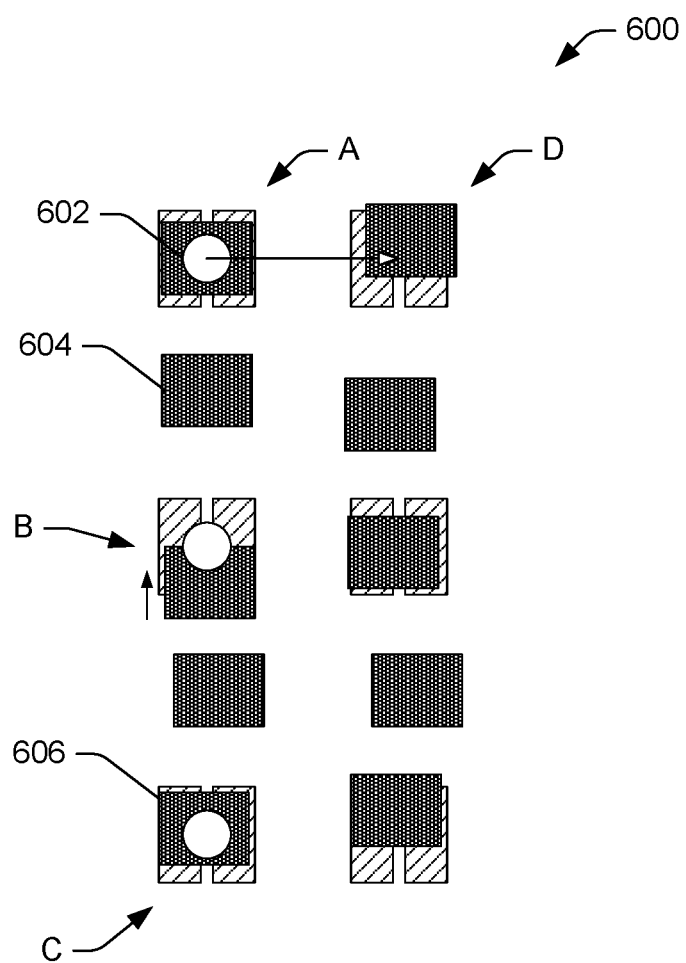
FIG. 6 illustrates a top-down schematic representation of a plurality of impact wires arranged in a matched-pitch configuration and example movements that a transfer apparatus may make to transfer semiconductor device die according to an embodiment of this disclosure.
Figure 6:
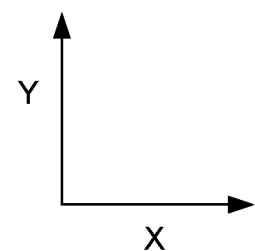

FIG. 6 illustrates a top-down schematic representation of a plurality of impact wires 602 arranged in a matched-pitch configuration and example movements that the direct transfer apparatus 100 may make to transfer semiconductor device die 604 according to an embodiment. FIG. 6 depicts how the plurality of impact wires 602 arranged in the matched-pitch configuration may benefit a scenario in which either the semiconductor device die 604 or the circuit traces 606 may be substantially evenly spaced. In the specific example depicted by FIG. 6, the circuit traces 606 are shown as being relatively evenly spaced and the plurality of impact wires 602 are arranged to align thereto. However, in an embodiment, the plurality of impact wires 602 may be arranged to align with the semiconductor device die 604. As shown in FIG. 6, having the plurality of impact wires 602 aligned with the circuit traces 606 may reduce the amount of adjustments that need to be made in order to complete transfers of semiconductor device die 604. For example, positions A and C in FIG. 6 depict locations where a transfer can immediately be completed without any adjustment. Position B depicts a location where a slight adjustment of one of the semiconductor device die 604 may be the only adjustment required to complete a transfer of the semiconductor device die 604. As mentioned previously, the transfer mechanism may prioritize transfers requiring only small adjustments before making large adjustments to make other transfers occur. In an embodiment, the transfer mechanism may make the small adjustments on a slow axis of movement, while making the large adjustments on a fast axis of movement, such as to "jump" to position D before making the transfer at position D.

Figure 7:
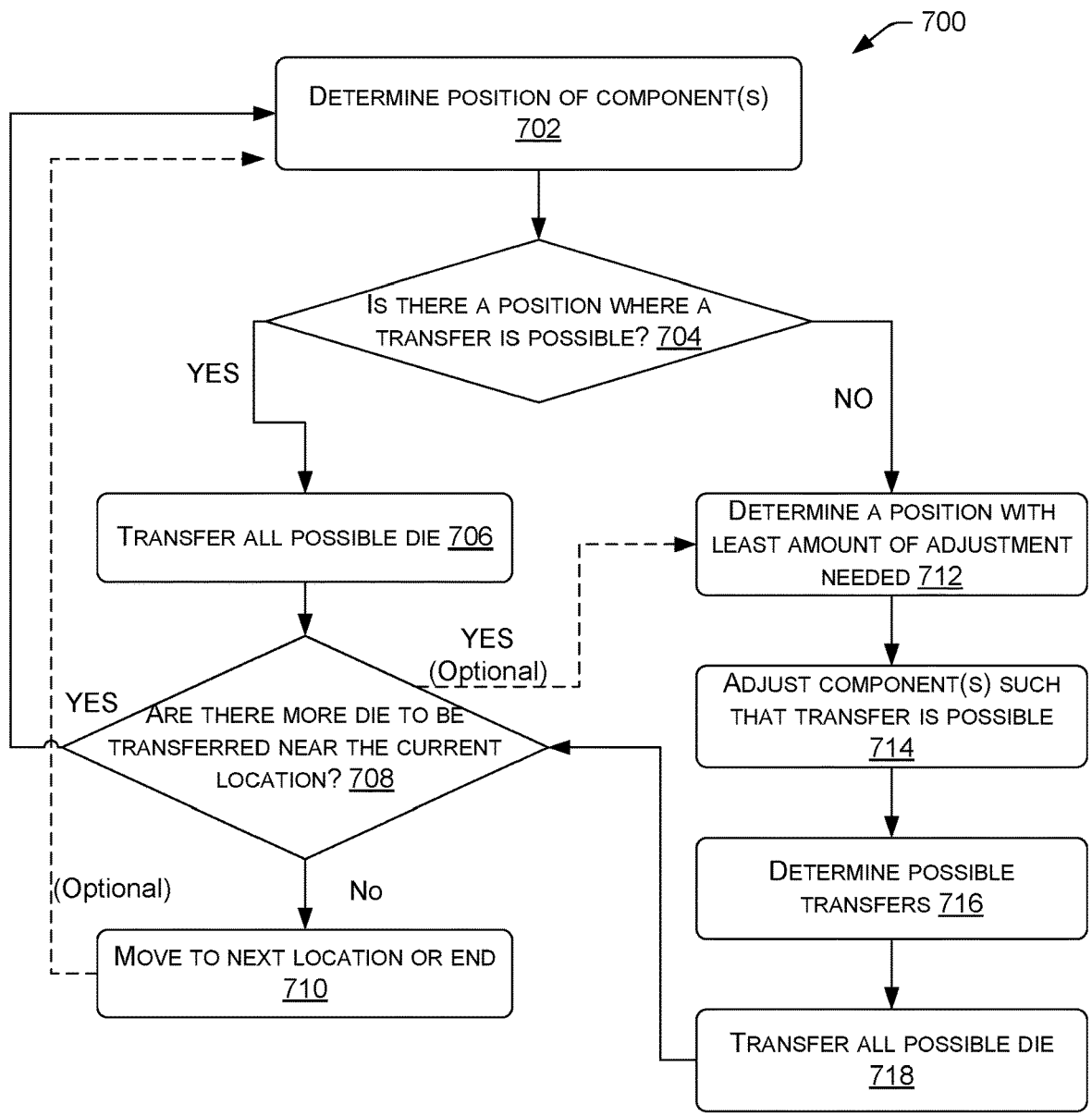
FIG. 7 illustrates a method for determining adjustments made by a transfer apparatus for transferring semiconductor device die according to an embodiment of this disclosure.

FIG. 7 illustrates a method 700 for determining adjustments made by the direct transfer apparatus 100 for transferring semiconductor device die according to an embodiment of this application. For ease of explanation, the process 700 is described as being performed at least in part by the direct transfer apparatus 100. However, in an embodiment, the process 700 may be performed by other apparatus and/or an outside controller or computing resource. Notably, while any one and/or all of the steps may be performed by a human operator, due to the nature of the application along with the size of the product components and desired speeds of work, the steps are best left to the processing capabilities of an electronic device. Additionally, and/or alternatively, in an embodiment, any one and/or all of the steps may be fully automated and carried out by the direct transfer apparatus 100.

The method 700 (as well as each process described herein) is illustrated as a logical flow graph, each operation of which represents a sequence of operations that can be implemented by hardware, software, or a combination thereof. In the context of software, the operations represent computer-executable instruction stored on one or more computer-readable media that, when executed by one or more processors, perform the recited operations. Generally, computer-executable instructions include routines, programs, objects, components, data structures, and the like that perform particular functions or implement particular abstract data types.

The computer-readable media may include non-transitory computer readable storage media, which may include hard drives, floppy diskettes, optical disks, CD-ROMs, DVDs, read-only memories (ROMs), random access memories (RAMs), EPROMS, EEPROMS, flash memory, magnetic or optical cards, solid-state memory devices, or other types of storage media suitable for storing electronic instructions. In addition, in some embodiments the computer-readable media may include a transitory computer-readable signal (in compressed or uncompressed form). Examples of computer-readable signals, whether modulated using a carrier or not, include, but are not limited to, signals that a computer system hosting or running a computer program can be configured to access, including signals downloaded through the Internet or other networks. Finally, unless otherwise noted, the order in which the operations are described is not intended to be construed as a limitation, and any number of the described operations can be combined in any order and/or in parallel to implement the process.

At 702, an apparatus may determine a position of one or more components. In an embodiment, the apparatus may determine the location of each of the components. As used previously, the term components includes, but may not be limited to, a transfer head (e.g., dot matrix transfer head), a wafer tape and individual semiconductor device die disposed thereon, and a product substrate and individual circuit traces or desired transfer locations thereon. Therefore, at step 702, the apparatus may determine the location of each of these components. More specifically, at step 702, the apparatus may focus on a location over which the transfer head is directly above, as illustrated by FIGS. 2-5. The apparatus may determine the location of each of a plurality of impact wires and may determine where multiple transfer locations and semiconductor device die are relatively oriented. Step 702 may be accomplished prior to any transfers being completed such that the transfer apparatus locates and maps the location of each of the transfer locations and semiconductor device die. In such an embodiment, the apparatus knows the location of each of the transfer locations and semiconductor device die and merely has to determine the location of the transfer head relative to the known position of the other components. However, in another embodiment, the apparatus may determine the locations of the components in real time. That is, as the transfer head moves along over the substrates, one or more sensors may "look ahead" and determine the locations of the components as the transfer process is being completed.

At step 704, the apparatus may determine if there are any positions where a transfer is possible without any adjustment. That is, once the transfer head has moved to a specific location, it may determine if there are any locations where an impact wire, a semiconductor device die, and a transfer location (such as a circuit trace, used as an example transfer location herein) are sufficiently aligned to complete a transfer of the semiconductor device die. As mentioned previously, an impact wire, semiconductor device die, and a transfer location do not have to be perfectly aligned about a central axis. However, in an embodiment, the apparatus may determine if they are aligned within a specific tolerance threshold. Such a threshold tolerance may be predetermined based on constraints of quality of a resulting product. If the apparatus determines that the three components are sufficiently aligned within the threshold, the process will continue to step 706.

At step 706, the apparatus may actuate at least one and/or all of the impact wires that are sufficiently aligned with a semiconductor device die and a transfer location. For example, if the apparatus determines that the first, third, and fourth impact wires are sufficiently aligned with the other components, the transfer head may concurrently or sequentially actuate the first, third, and fourth impact wires.

Once the apparatus has transferred all of the possible semiconductor device die that can be transferred without adjustment, the apparatus may determine if there are more semiconductor device die that can be transferred via micro adjustments of movement from the current location, at step 708. If there are no more semiconductor device die that can be transferred by relatively micro adjustments, the transfer head may move to the next location or if there are no more transfers to be made, the process will end at step 710. However, if there are more semiconductor device die that need to be transferred, the process may begin again at step 702, as shown by the optional arrow from step 710 to step 702. Alternatively, since the apparatus has determined a location of the components and has already transferred the possible semiconductor device die without adjustment, the apparatus may skip steps 702 and 704 and may follow the "No" path in response to step 704 since there may be no more possible transfer locations available without some adjustment. In such an embodiment, the optional "Yes" path from step 708 may follow to step 712, as shown in FIG. 7.

Going back to step 704, if the apparatus determines that there are not any transfer possibilities where the three components are sufficiently aligned within the threshold, the process will continue to step 712. At step 712, the apparatus may determine a location to transfer a semiconductor device that requires the least amount of adjustment. Thus, the apparatus will determine the next transfer that can be completed in the least amount of time with the least amount of movement (of one or more components) necessary. However, in an embodiment, at step 712, the apparatus may determine a sequence of movements that will optimize the adjustments necessary to complete the rest of the transfers in a given location (i.e., section of the wafer tape).

At step 714, the apparatus may adjust one or more components so that the three components are sufficiently aligned to complete a transfer. In the multi-pitched configuration described above, the apparatus may adjust up to all three of the components. The apparatus may adjust all three components concurrently in the multi-pitch configuration to limit the distance that any one component would have to move to align the three components, thus reducing time between transfers. However, the apparatus may leave one or more components stationary and move one or more other components relative to the first component, similar to the example described in FIG. 4. In the matched-pitch configuration described above, the apparatus may leave two of the components stationary while only adjusting one other component while making small adjustments, similar to the example described in FIG. 5. Additionally, and/or alternatively, the apparatus may actuate one or more impact wires to adjust a position of one or more semiconductor device die located on the wafer tape.

At step 716, once the adjustment(s) have been completed to transfer at least one semiconductor device die, the apparatus may determine if there are other possible semiconductor device die that could be transferred after making the adjustment(s).

At step 718, the apparatus may actuate at least one and/or all of the impact wires that are sufficiently aligned with a semiconductor device die and a transfer location.

The process may then return to step 708 and determine whether there are more semiconductor device die to be transferred in a location near to the transfer head.

As mentioned previously, in an embodiment, the apparatus may prioritize large and small adjustments on different axes of movement. For example, the small adjustments (or adjustments requiring an adjustment distance that is below a predetermined distance threshold) made at step 714 may be made on a slow axis of movement of the apparatus and the larger adjustments (or adjustments requiring an adjustment distance that is above a predetermined distance threshold) (e.g., switching rows or moving the transfer head to the next location of step 710) may be made on a fast axis of movement. This would optimize the ability of the apparatus and reduce time between transfers. However, in an embodiment, the process may be completed in the opposite, with small movements being made on the fast axis of movement and large movements being made on the slow axis of movement. This may be beneficial when there is a great quantity of small adjustments to be made such that the total time necessary to make small adjustments would be greater than the time to make one large adjustment. It should be noted that in the specific example of this application the "small" and "large" movement may be made on the order of microns and the "fast" and "slow" movement may be made on the order of milliseconds. For example, the small adjustments may be around or less than 0.45 mm +/−50 microns and the large adjustments being around 2 mm. Furthermore, the "fast" movements may be between 0.1 and 10 milliseconds, while the slow movement may be between 10 and 30 milliseconds. The given quantities are merely examples and are not necessarily limiting the features or acts described.

CONCLUSION

Although several embodiments have been described in language specific to structural features and/or methodological acts, it is to be understood that the claims are not necessarily limited to the specific features or acts described. Rather, the specific features and acts are disclosed as illustrative forms of implementing the claimed subject matter. Furthermore, the use of the term "may" herein is used to indicate the possibility of certain features being used in one or more various embodiments, but not necessarily in all embodiments.

What is claimed is:

1. A method comprising:
   determining a position of one or more impact wires disposed in a transfer head, one or more semiconductor device die on a first substrate, and one or more transfer locations on a second substrate;
   determining whether there are at least two positions on the second substrate where at least one impact wire, at least one semiconductor device die, and at least one transfer location are aligned within a threshold tolerance;
   adjusting the position of at least one of the one or more impact wires, the one or more semiconductor device die, or the one or more transfer locations, based at least in part on a determination that at least two impact wires, at least two semiconductor device die, and at least two transfer locations are aligned below the threshold tolerance;
   determining whether the adjusting includes adjusting the position of the at least one of the one or more impact wires, the one or more semiconductor device die, or the one or more transfer locations by an adjustment distance that is above or below a predetermined distance threshold;
   completing the adjustment on a first axis of movement, based at least in part on a determination that the adjustment distance is below the predetermined distance threshold; and
   transferring, based at least in part on completing the adjustment and by independently actuating the at least two impact wires, the at least two semiconductor device die from the first substrate to the at least two transfer locations on the second substrate, based at least in part on determining that there are at least two positions where the at least one impact wire, the at least one semiconductor device die, and the at least one transfer location are aligned within the threshold tolerance.

2. The method according to claim 1, wherein the transfer head is a dot matrix transfer head.

3. The method according to claim 1, wherein the first substrate is a wafer tape.

4. The method according to claim 1, wherein the second substrate is a circuit substrate having one or more circuit traces thereon, and
   wherein determining the position of the one or more transfer locations includes determining the position of the one or more transfer locations along the one or more circuit traces disposed on the circuit substrate.

5. The method according to claim 1, wherein determining the position of the one or more impact wires, the one or more semiconductor device die, and the one or more transfer locations includes determining a position of the one or more impact wires, the one or more semiconductor device die, and the one or more transfer locations relative to one another.

6. The method according to claim 1, wherein the method further comprises:
   completing the adjustment on a second axis of movement, based at least in part on determining that the adjustment distance is above the predetermined distance threshold,
   wherein the first axis of movement completes the adjustment at a first rate of travel and the second axis of movement completes the adjustment at a second rate of travel, the second rate of travel being greater than the first rate of travel.

7. The method according to claim 1, wherein transferring the at least two semiconductor device die from the first substrate to the at least two transfer locations includes actuating the at least two impact wires so as to press down on the semiconductor device die such that the at least two semiconductor device die detach from the first substrate and attach to the at least two transfer locations on the second substrate.

8. The method according to claim 1, wherein transferring the at least two semiconductor device die from the first substrate to the at least two transfer locations includes actuating all of the one or more impact wires that are aligned with respective semiconductor device die and transfer locations within the threshold tolerance.

9. The method according to claim 1, wherein adjusting the position of at least one of the one or more impact wires, the one or more semiconductor device die, or the one or more transfer locations includes determining a location that requires a least amount of adjustment to sufficiently align the at least two impact wires, the at least two semiconductor device die, and the at least two transfer locations.

\* \* \* \* \*